United States Patent [19]
Hasegawa

[11] Patent Number: 5,528,511
[45] Date of Patent: Jun. 18, 1996

[54] DELAY TIME VERIFIER AND DELAY TIME VERIFICATION METHOD FOR LOGIC CIRCUITS

[75] Inventor: Takumi Hasegawa, Tokyo, Japan

[73] Assignee: NEC Corporation, Tokyo, Japan

[21] Appl. No.: 223,722

[22] Filed: Apr. 6, 1994

[30] Foreign Application Priority Data

Apr. 7, 1993 [JP] Japan .................................. 5-105017

[51] Int. Cl.⁶ ...................................... G06F 17/50
[52] U.S. Cl. ............................. 364/489; 364/488
[58] Field of Search ................... 364/488, 489, 364/490, 491, 528; 395/500

[56] References Cited

U.S. PATENT DOCUMENTS

| | | | |
|---|---|---|---|
| 5,095,454 | 3/1992 | Huang | 364/578 |
| 5,210,700 | 5/1993 | Tom | 364/489 |
| 5,222,030 | 6/1993 | Dangelo et al. | 364/489 |
| 5,355,321 | 10/1994 | Grodstein et al. | 364/489 |
| 5,396,435 | 3/1995 | Ginetti | 364/489 |

*Primary Examiner*—Vincent N. Trans
*Attorney, Agent, or Firm*—Foley & Lardner

[57] ABSTRACT

A delay time verifier to verify the delay time for a logic circuit using a time verification model prepared according to the graph theory. It comprises a verified model information file to store in advance the delay time verification information for each of the arcs in the time verification model including delay time for each rise/fall type of the signal at the start point node and the end point node of the arc, an invalidness specifier to specify an arc with invalid data and rise or fall of the signal to be invalidated for the arcs where only one of rise and fall signals is allowed to be valid, a modifier to modify the delay time verification information stored in the file so that the information for the arcs whose rise or fall signal specified by the invalidness specifier becomes invalid is modified, and a delay time verifier to verify the delay time of the logic circuit based on the delay time verification information after modification by the modifier.

6 Claims, 8 Drawing Sheets

FIG.6

| ARC | START POINT | END POINT | START POINT / END POINT ||||
|---|---|---|---|---|---|---|
| | | | R/R | R/F | F/R | F/F |
| a | p | q | 0 | × | × | 0 |
| b | q | r | 1 | × | × | 1 |
| c | r | s | 0 | × | × | 0 |
| d | s | t | 0 | × | × | 0 |
| e | t | u | 0 | × | × | 0 |
| f | p | v | 0 | × | × | 0 |
| g | v | t | 0 | × | × | 0 |

FIG.7

| ARC C | RISE : R | ~20 |
|---|---|---|

FIG.8

| ARC | START POINT | END POINT | START POINT / END POINT | | | |
|---|---|---|---|---|---|---|
| | | | R/R | R/F | F/R | F/F |
| a | p | q | 0 | × | × | 0 |
| b | q | r | 1 | × | × | 1 |
| c | r | s | × | × | × | 0 |
| d | s | t | 0 | × | × | 0 |
| e | t | u | 0 | × | × | 0 |
| f | p | v | 0 | × | × | 0 |
| g | v | t | 0 | × | × | 0 |

FIG.10

| R/F TYPE | | | | | | DELAY TIME T(ns) | | | | | |
|---|---|---|---|---|---|---|---|---|---|---|---|
| p | q | r | s | t | u | a | b | c | d | e | TOTAL |
| R | R | R | R | R | R | 0 | 1 | × | 0 | 0 | × |
| F | R | R | R | R | R | × | 1 | × | 0 | 0 | × |
| R | F | R | R | R | R | × | × | 0 | 0 | 0 | × |
| ⋮ | ⋮ | ⋮ | ⋮ | ⋮ | ⋮ | ⋮ | ⋮ | ⋮ | ⋮ | ⋮ | ⋮ |
| R | F | F | F | F | F | × | 1 | 0 | 0 | 0 | × |
| F | F | F | F | F | F | 0 | 1 | 0 | 0 | 0 | 1 |

FIG.11

| R/F TYPE | | | | DELAY TIME T(ns) | | | |
|---|---|---|---|---|---|---|---|
| p | v | t | u | f | g | e | TOTAL |
| R | R | R | R | 0 | 0 | 0 | 0 |
| F | F | F | F | 0 | 0 | 0 | 0 |

FIG.12
(PRIOR ART)

| \multicolumn{6}{c|}{R/F TYPE} | \multicolumn{5}{c|}{DELAY TIME T(ns)} | |
|---|---|---|---|---|---|---|---|---|---|---|---|
| p | q | r | s | t | u | a | b | c | d | e | TOTAL |
| R | R | R | R | R | R | 0 | 1 | 0 | 0 | 0 | 1 |
| F | R | R | R | R | R | × | 1 | × | 0 | 0 | × |
| R | F | R | R | R | R | × | × | 0 | 0 | 0 | × |
| ⋮ | ⋮ | ⋮ | ⋮ | ⋮ | ⋮ | ⋮ | ⋮ | ⋮ | ⋮ | ⋮ | ⋮ |
| R | F | F | F | F | F | × | 1 | 0 | 0 | 0 | × |
| F | F | F | F | F | F | 0 | 1 | 0 | 0 | 0 | 1 |

FIG.13
(PRIOR ART)

| R/F TYPE | | | | DELAY TIME T(ns) | | | |
|---|---|---|---|---|---|---|---|
| p | v | t | u | f | g | e | TOTAL |
| R | R | R | R | 0 | 0 | 0 | 0 |
| F | F | F | F | 0 | 0 | 0 | 0 |

DELAY TIME VERIFIER AND DELAY TIME VERIFICATION METHOD FOR LOGIC CIRCUITS

BACKGROUNDS OF THE INVENTION

1. Field of the Invention

The present invention relates to a delay time verifier for logic circuits and particularly relates to a delay time verifier which generates a graph theory expression of a logic circuit and verifies the delay of that logic circuit using information for delay time verification represented by the logic in such graph theory model.

2. Description of the Related Art

Conventional delay time verification methods for a logic circuit will be described below taking an example where a simple logic circuit model shown in FIG. 2 operates with the signal waveform as shown in FIG. 3.

In FIG. 2, a device 230 receives as input the signal from an input terminal 210 and, 1 ns later, outputs the same signal as the input signal to a path 250. A device 240 is an OR circuit which receives, as two inputs, the signals from the path 250 and the input terminal 210 and outputs their logical OR to an output terminal 220 with a delay time of 0 (ns). Other operations are also supposed to have a delay time of 0.

As shown in FIG. 3, the signal at the input terminal 210 rises at the time 0 ns and falls at the time 2 ns. For the path 250, the same signal as the input terminal 210 appears with a delay of 1 ns. In other words, the signal at the path 250 rises at the time 1 ns and falls at the time 3 ns. The signal at the output terminal 220 is the logical OR of the signal at the path 250 and the signal at the input terminal 210 and therefore rises at the time 0 ns and falls at the time 3 ns.

One of the methods for delay time verification in such a logic circuit model is application of the graph theory. It is a known theory where a logic circuit is expressed as a validness graph according to certain rules so that various processing regarding characteristics of that logic circuit can be made easily. Details of the graph theory are described, for example, in known literature including (1) R. J. Wilson, translated by Sinji Saito and Takao Nishiseki, "Introduction to Graph Theory", Kindai Kagakusha and (2) Masao Iri and Isao Shirakawa, "Seminar of Graphic Theory (Foundation and Application)".

FIG. 4 shows the circuit model of FIG. 2 expressed as a graph according to the graph theory. Specifically, it is a validness graph which has external terminals and other device terminals as nodes p to v, and is provided with arcs a to g whose directions are the flow of signals between the applicable nodes. These arcs "a" to "g" have their delay time as their weight. The delay time is provided for each rise or fall type (R/F type) for the start point and end point nodes for every arc. If there is no delay time, the weight is expressed as "x" (undefined).

In FIG. 4, which represents a validness graph of the circuit model shown in FIG. 2, the arc "a" corresponds to the signal path between the input terminal 210 and the input terminal of the device 230, the arc "b" to the internal signal path of the device 230, the arc "c" to the signal path 250, the arc "d" to the internal signal path of the device 240, the arc "e" to the signal path between the output terminal of the device 240 and the output terminal 220, arc "f" to the signal path between the input terminal 210 and the input terminal of the device 240, and the arc "g" to the internal signal path of the device 240. The arc "a" has its start point node at p and end point node at q; the arc "b" has its start point node at q and end point node at r; the arc "c" has its start point node at r and end point node at s . . . . FIG. 5 shows correspondence between such circuit model and the validness graph.

The weight of an arc is the delay time provided for each R/F type of the start point and end point nodes. FIG. 6 shows the weights given to the arcs for the operation waveform in FIG. 3. In FIG. 6, "0" and "1" represent the delay time in ns and "X" means that the delay time is undefined.

In general, a combination of rise (R) and fall (F) of the signal for the start point node and end point node (hereinafter simply referred to as start and end) for an arc is, as shown in FIG. 6, one of four possibilities: start with R and end with R (R/R), start with R and end with F (R/F), start with F and end with R (F/R) and start with F and end with F (F/F). However, in the example shown in FIGS. 2 and 3, it is not necessary to consider R/F and F/R for the arcs and they are treated as "undefined". Other two combinations R/R and F/F are respectively provided with a delay time as the 5 weight according to the example in FIG. 3.

In actual delay verification, information shown in FIGS. 4 and 6 is in advance stored in a verified model information file. For both of the first series of paths (arc "a" → "b" → "c" → "d" → "e") and the second series of paths (arc "f" → "g" → "e"), the weight is determined for each of R/F type for the start and end of every arc as in FIG. 6 so that the delay time of each series of paths can be obtained as the sum of the determined weights.

The delay time for the processes from the input terminal 210 to the output terminal 220 in the circuit model of FIG. 2 is, as obviously understood from the waveform example of FIG. 3, 0 ns corresponding to the delay time of the lower route (arc "f" → "g") in FIG. 2 in case of rise (R) and 1 ns corresponding to the upper route (arc "a" → "b" → "c" → "d") in FIG. 2 in case of fall (F).

This is because the device 240 is an OR device and the delay time for the signal with rise (R) passing the upper route in FIG. 2 does not have any meaning, or the rise (R) signal for the path 250 (arc "c") has no effect (invalid) on determination of the delay time.

However, the conventional delay time verification method using a verified model does not have any information that the rise (R) signal at the arc "c" does not have any meaning (invalid) for determination of the delay time and processes the signal as valid data (In FIG. 6, a weight of 0 ns is given to R/R of the arc "c"). It is judged here that the delay time of the signal from the upper route in FIG. 2 is meaningful (valid).

Specifically, the delay time is determined for all paths of the circuit model in FIG. 2, so as to obtain the results as shown in FIGS. 12 and 13. As understood from the figures, the delay time of the route in FIG. 12 is 1 ns for both rise and fall. Comparison of FIGS. 12 and 13 shows that the verification results here are different from the actual delay time.

SUMMARY OF THE INVENTION

It is an object of the present invention to provide a delay time verification unit and a delay time verification method for logic circuits which provides the correct delay time even when either of rise or fall of the signal is meaningless in a delay time verification process utilizing verified model information where external terminals and circuit device terminals are treated as nodes between which arcs with the same direction as the signal therebetween are assumed and the arcs are provided with the delay time for each as the weights.

According to a preferred embodiment of the present invention to attain the above object, a delay time verifier for logic circuits comprises, when supposing a time verification model according to the graph theory where the external terminals and circuit device terminals of a logic circuit subject to delay time verification are treated as nodes between which arcs with the same direction as the signal flow between said nodes are assumed and the signal delay time for the part of said logic circuit corresponding to the applicable arc is provided as the arc weight, storage means to store in advance the delay time verification information for each of the arcs including delay time for each rise/fall type of the signal at the start point node and the end point node of the arc, invalidness specification means to specify an arc with invalid data and rise or fall of the signal to be invalidated for the arcs where only one of rise and fall signals is allowed to be valid, modification means to modify the delay time verification information stored in said storage means so that the information about the arcs whose rise or fall signal specified by said invalidness specification means becomes invalid is modified, and delay time verification means to verify the delay time of said logic circuit based on the delay time verification information after modification by said modification means.

According to another preferred embodiment, a delay time verifier further comprises modified model information storage means to store said delay time verification information for said arcs after modified by said modification means as the modified model information and is characterized in that said delay time verification means verifies the delay time of said logic circuit based on said delay time verification information after modification in said modified model information storage means.

According to still another preferred embodiment of the present invention to attain the above object, a delay time verifier for logic circuits comprises, when supposing a time verification model where the external terminals and circuit device terminals of a logic circuit subject to delay time verification are treated as nodes between which arcs with the same direction as the signal flow between said nodes are assumed and the signal delay time for the part of said logic circuit corresponding to the applicable arc is provided as the arc weight, storage means to store in advance the delay time verification information for each of the arcs including delay time for each rise/fall type of the signal at the start point node and the end point node of the arc, invalidness specification means to specify an arc with invalid data and rise or fall of the signal to be invalidated for the arcs where only one of rise and fall signals is allowed to be valid, modification means to modify the delay time verification information stored in said storage means so that the information about the arcs whose rise or fall signal specified by said invalidness specification means becomes invalid is modified, and delay time verification means to verify the delay time of said logic circuit based on the delay time verification information after modification by said modification means, and the delay time verification means is characterized by that it selects all signal paths for said logic circuit, calculates the total sum of the delay time provided to the arcs in said signal paths for all possible combinations of rise and fall signals at the nodes constituting said signal paths, compares said total sums of delay time for the signals of the same type for the signal paths with the same start and end nodes among said signal paths, and judges the delay time of the signal path with the maximum delay time to be the delay time of said logic circuit for the signal.

According to another preferred embodiment of the present invention to attain the above object, a delay time verification method for logic circuits comprises, when supposing a time verification model according to the graph theory where the external terminals and circuit device terminals of a logic circuit are treated as nodes between which arcs with the same direction as the signal flow between said nodes are assumed and the signal delay time for the component of said logic circuit corresponding to the applicable arc is provided as the arc weight, a storage step to store the delay time verification information for each of the arcs including delay time for each rise/fall type of the signal at the start point node and the end point node of the arc, an invalidness specification step to specify an arc with invalid data and rise or fall of the signal to be invalidated for the arcs where only one of rise and fall signals is allowed to be valid, a modification step to modify said delay time verification information so that the information about the arcs whose rise or fall signal becomes invalid is modified, and delay time verification step to verify the delay time of said logic circuit based on the delay time verification information after modification by said modification means.

Other objects, features and advantages of the present invention will become clear from the detailed description given herebelow.

BRIEF DESCRIPTION OF THE DRAWINGS

The present invention will be understood more fully from the detailed description given herebelow and from the accompanying drawings of the preferred embodiment of the invention, which, however, should not be taken to be limitative to the invention, but for explanation and understanding only.

In the drawings:

FIG. 6 is a diagram to show the verified model information for delay verification of the circuit in FIG. 4;

FIG. 7 is a diagram to show an example of invalidness specification by an invalidness specifier according to the present invention for FIG. 2;

FIG. 8 is a diagram to show the verified model information modified according to the invalidness specification information of the invalidness specifier according to the present invention;

FIG. 10 is a diagram to show an example of delay verification results according to the present invention;

FIG. 11 is a diagram to show an example of delay verification results according to the present invention;

FIG. 12 is a diagram to show an example of delay verification results by a conventional delay time verifier; and FIG. 13 is a diagram to show an example of delay verification results by a conventional delay time verifier.

DESCRIPTION OF THE PREFERRED EMBODIMENT

Referring to the attached figures, preferred embodiments of the present invention will be described in details below.

Figure 1:
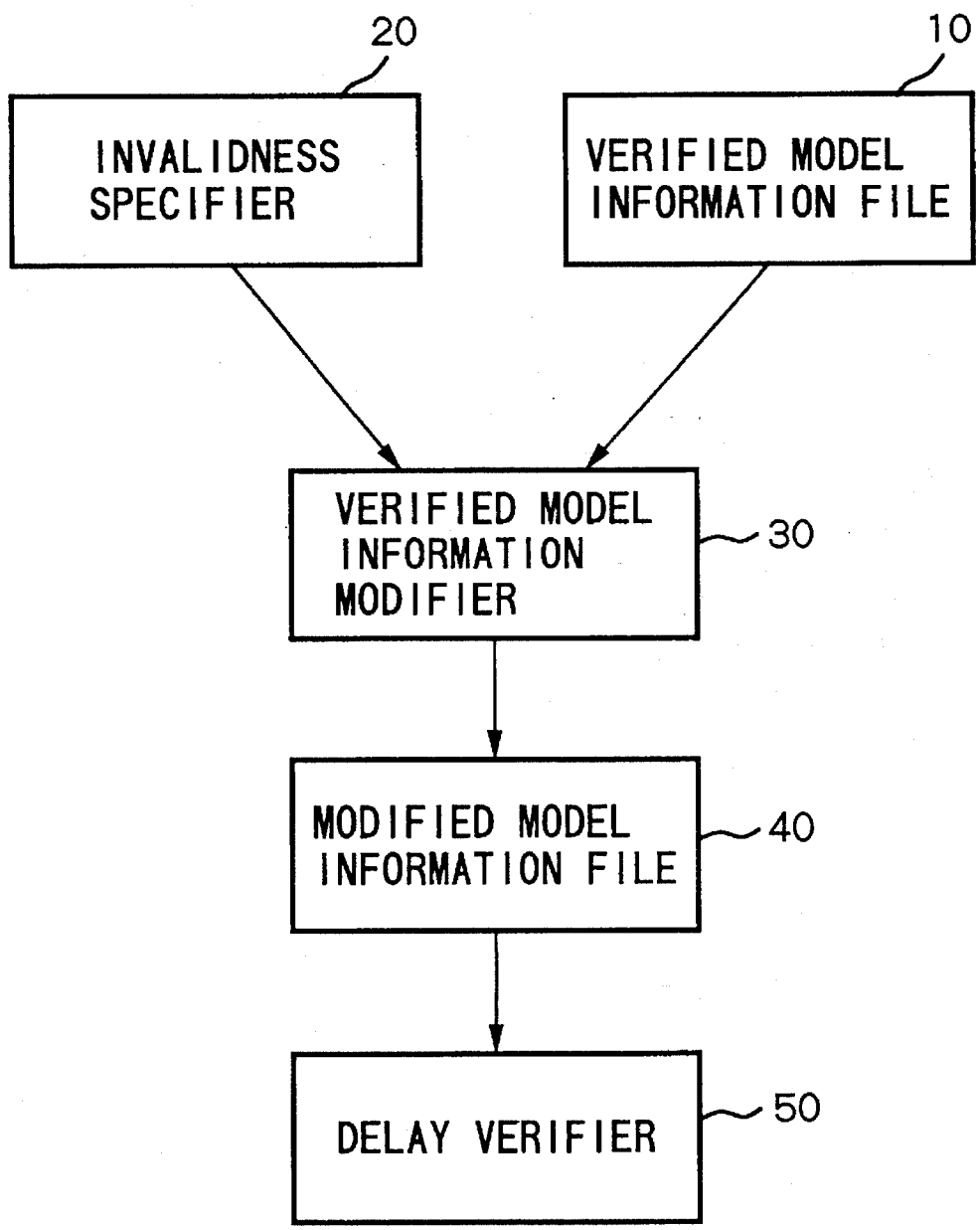
FIG. 1 is a block diagram to show the configuration of a delay time verifier according to an embodiment of the present invention.

FIG. 1 is a functional block diagram to show the function of a delay time verifier according to an embodiment of the present invention. In the figure, a verified model information file 10 is a file to store in advance the information for delay time verification. The verified model information file 10 has in advance the information shown in FIGS. 4, 5 and 6 for the model shown in FIGS. 2 and 3. Specifically, external terminals and circuit device terminals of a logic circuit subjected to delay time verification are treated as nodes, which are connected by arcs between them. The arcs have the same direction as the signal flow between the applicable nodes and are provided with the delay time as weights. The delay time is given for each R/F type for the start and end of the arcs.

Figure 2:
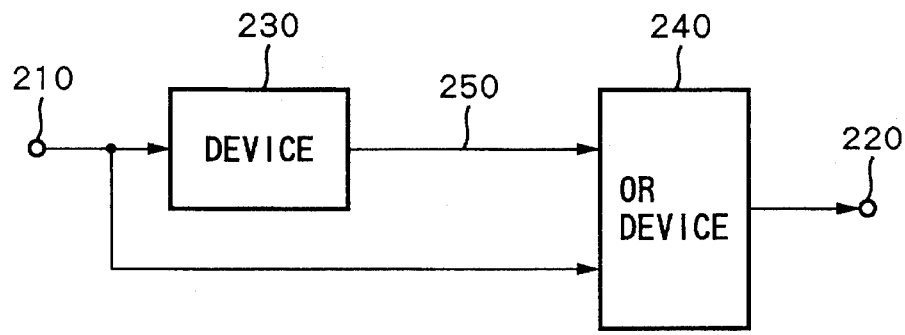
FIG. 2 is a schematic diagram to show the configuration of a logic circuit as a verified model.
Figure 3:
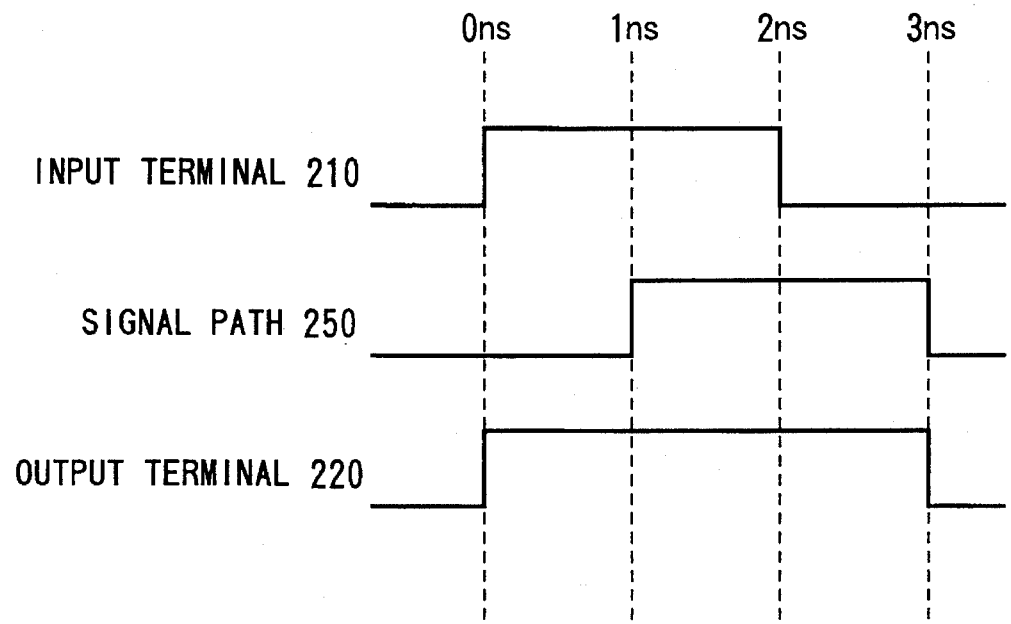
FIG. 3 is a diagram to show a signal waveform for the parts of the logic circuit of FIG. 2.

An invalidness specifier 20 specifies the signal type (rise (R) or fall (F)) to be invalidated for the arcs where only one of the rise and fall signals is valid. In the example as shown in FIGS. 2 and 3, it is necessary to invalidate the rise (R) of the signal for the path 250 (corresponding to the arc "c"), and as shown in FIG. 7, the arc "c" and the rise R are specified.

A verified model information modifier 30 modifies, according to the arc and the signal type (R or F) to be invalidated as specified by the invalidness specifier 20, the information in the verified model information file 10. Specifically, in case of the example shown in FIGS. 2 and 3, it modifies the information of FIG. 6 to that in FIG. 8 according to the invalidation specification of FIG. 7. As shown in the figures, the weight for the arc "c" is modified so that "0" at R/R (rise for both start (r) and end (s)) for the start/end is changed to x, which means undefined (invalid). Such information after modification is temporarily stored to the modified model information file 40.

Figure 9:
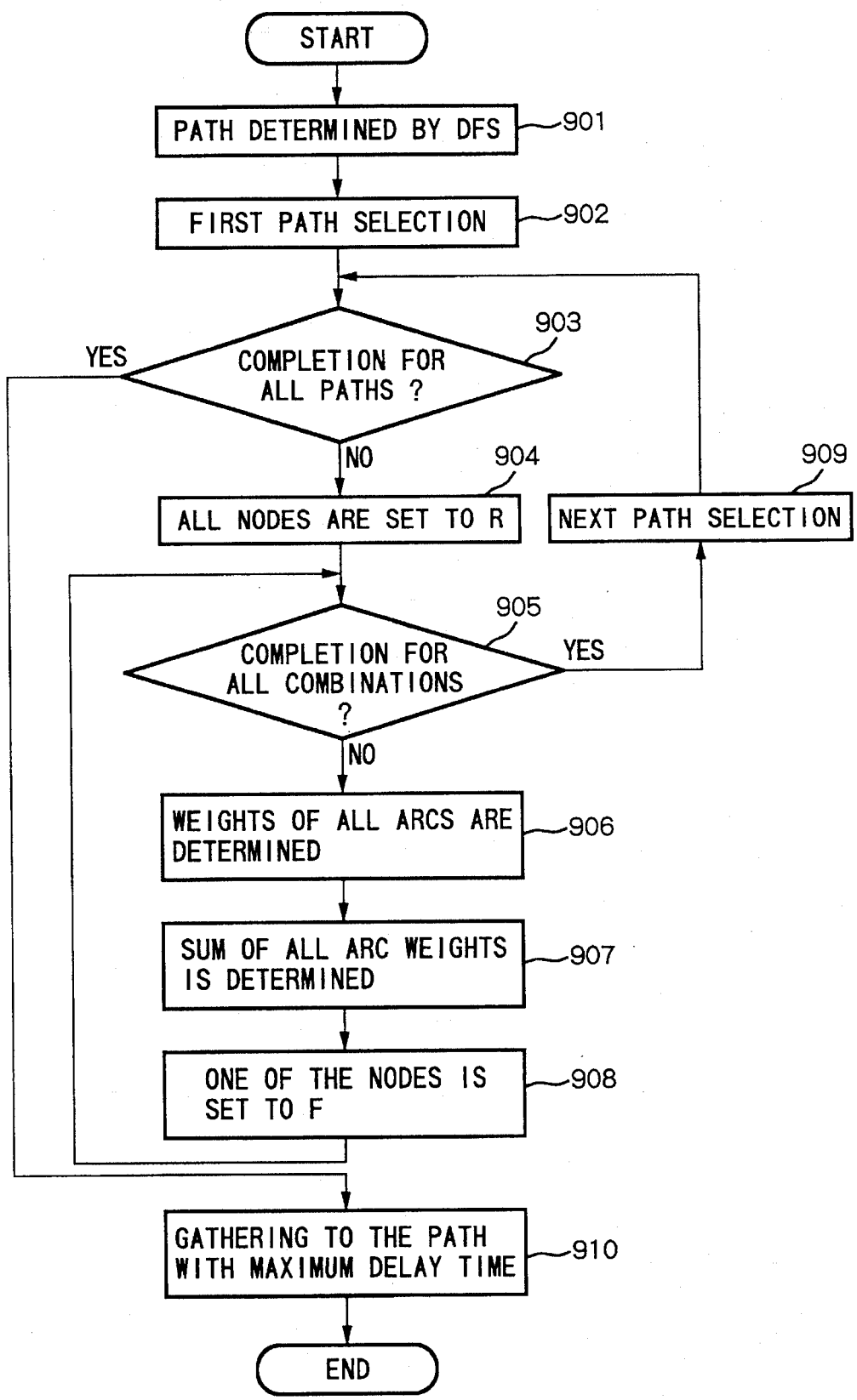
FIG. 9 is a flowchart to illustrate the operation contents of the delay verifier of FIG. 1.

A delay verifier 50 actually makes delay verification according to the information after modification by the verified model information modifier 30. The delay verification operation is made according to the same procedure as the conventional delay verification. FIG. 9 is a flowchart illustrating the procedure of the delay verification operation of the delay verifier 50.

Generally, there exists a plurality of signal paths in a verified model. Therefore, the delay time is determined for each path and, among the determined delay times, the paths with the same start and end are gathered together to determine the final delay time.

Firstly, to specify the paths for which the delay time is calculated, paths in a depth direction are picked up by the vertical search (DPS= Depth First Search) method (Step 901). One of the obtained paths is selected as the first path (Step 902), and the R/F type for all nodes of the path is set to R, for example (Step 904).

Figure 4:
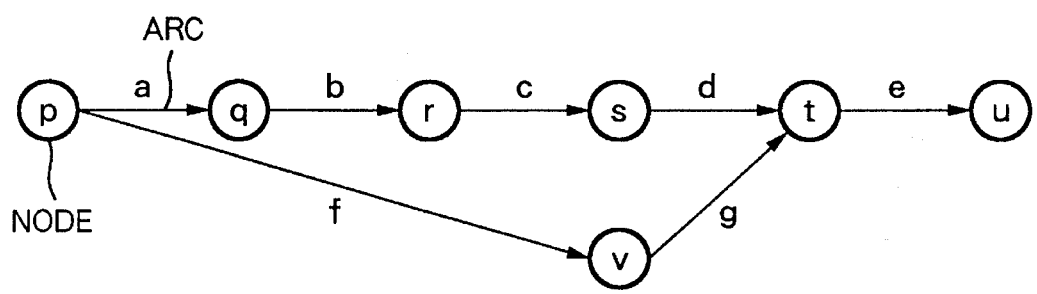
FIG. 4 is a diagram expressing the circuit of FIG. 2 according to the graph theory.
Figure 5:
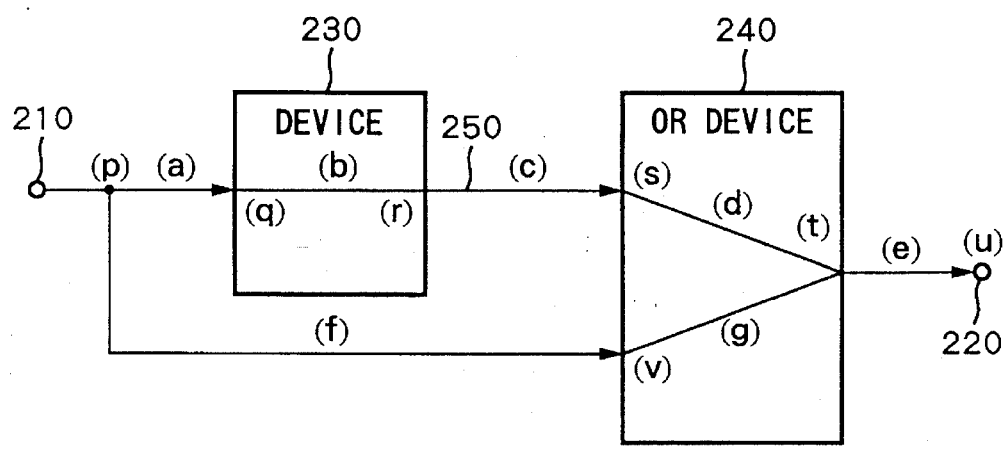
FIG. 5 is a diagram to show correspondence between the logic circuit of FIG. 2 and the graph of FIG. 4.

In the example of FIG. 4, if the first path is arc "a" → "b" → "c" → "d" → "e", then the nodes of the path are p, q, r, s, t and u. Suppose all of them are set to R. For this combination of R/F type for the nodes (i.e. R for all), the weight (delay time) is determined for the arcs "a" to "e" (Step 906).

The weight is determined based on the modified information stored to the modified model information file 40 shown in FIG. 8 and the results are shown at the top line of FIG. 10. Taking the weight of the arc "a" as an example, its start is p and the end is q and the R/F type is R for all nodes. By referring to R/R for the start/end point of the arc "a" in FIG. 8, it is found that the weight is 0. Similarly, the arc "b" with start at q and end at r has the R/F type of R for all nodes, and from R/R for the arc "b" in FIG. 8, it is found to have a weight of 1. Taking the arc "c", it starts at r and ends at s, with the R/F type of R for all nodes. By referring to R/R for the arc "c" in FIG. 8, it is known that the weight is modified to "X" (invalid).

Thus, when the R/F type of all nodes are R, the weight of the arcs are as shown at the top line of FIG. 10 and the total weight can be determined (Step 907). In this case, however, if any one of the weights is x (invalid), then the total is also x (invalid).

Next, suppose the R/F type of one node is F as the second combination of R/F type (Step 908). Specifically, as shown at line 2 of FIG. 10, the R/F type of the nodes is changed from {R, R, R, R, R, R} to {F, R, R, R, R, R}. The processes of Steps 906 and 907 are executed for such R/F type combination so that the sum of the arc weights is determined.

Then, in Step 908, the third R/F type combination is made with setting F at another node. Specifically, as shown at line 3 of FIG. 10, the R/F type for the nodes are {R, F, R, R, R, R}. Then, the processes of Steps 906 and 907 are executed for such R/F type combination.

Since there exists six nodes for the path in this embodiment, there are $2^6$ possible combinations of R/F types for the nodes, Processes of Steps 906 and 907 are executed for all of these $2^6$ combinations. The bottom line of FIG. 10 shows the weights of the arcs for the last combination {F, F, F, F, F, F}.

When this procedure is completed for all R/F type combinations for the nodes (all of $2^6$ combinations) (Step 905), then the second path is selected (Step 909). For the second path, too, Steps 904, 906, 907 and 908 are repeated in the same way. FIG. 11 shows the results for the second path. In the figure, results including x (invalid) are omitted.

Thus, when the above procedures are completed for all paths (Step 903), paths with the same start node and the same end node are put together to the path having the maximum delay time (step 910). In the example of FIGS. 10 and 11, the above first and second paths are put together. In this case, the first path has invalid delay time (x) for the rise (R) of the signal at the input terminal 210 as shown in the top line of FIG. 10 and a delay time of 1 ns for the fall (F) of the signal at the input terminal 210 as shown in the bottom line of FIG. 10. The second path has a delay time of 0 for both rise and fall as clearly understood from FIG. 11.

The maximum delay time is adopted for rise and fall so that the delay time of the circuit model in FIG. 2 is finally determined to be 0 ns for rise and 1 ns for fall. This coincides with the waveform in the time chart of FIG. 3, which means that the delay verification results are correct.

As described above, even when either of rise or fall signal at a particular location (arc) is invalid in logic circuit model information for delay analysis, correct delay verification results can be obtained by modifying the model information including such invalid signal in advance according to the present invention.

Although the invention has been illustrated and described with respect to an exemplary embodiment thereof, it should be understood by those skilled in the art that the foregoing and various other changes, omissions and additions may be made therein and thereto, without departing from the spirit and scope of the present invention. Therefore, the present invention should not be understood as limited to the specific embodiment set out above but to include all possible embodiments which can be embodied within a scope encompassed and equivalents thereof with respect to the features set out in the appended claims.

What is claimed is:

1. A delay time verifier for logic circuits, comprising:

storage means for storing in advance delay time verification information for each of a plurality of arcs including delay time for each rise/fall type of signal at a start point node and an end point node of an arc when supposing a time verification model according to graph theory where external terminals and circuit device terminals of a logic circuit subject to delay time verification are treated as nodes between which arcs with the same direction as signal flow between said nodes are assumed and signal delay time for a part of said logic circuit corresponding to the applicable arc is provided as the arc weight, invalidness specification means for specifying an arc and a signal type (rise or fall) of the arc with an invalid arc weight for arcs where the arc weight of only one of rise and fall signals is allowed to be valid, modification means for modifying the delay time verification information stored in said storage means so that information about arcs whose arc weight is specified by said invalidness specification means as being invalid is modified, and delay time verification means for verifying the delay time of said logic circuit based on the delay time verification information after modification by said modification means.

2. A delay time verifier for logic circuits as set forth in claim 1, further comprising:

modified model information storage means for storing delay time verification information after modification by said modification means as modified information; and wherein said delay time verification means verifies the delay time of said logic circuit based on said delay time verification information after storage in said modified model information storage means.

3. A delay time verifier for logic circuits, comprising:

storage means for storing in advance delay time verification information for each of a plurality of arcs including delay time for each rise/fall type of signal at a start point node and an end point node of an arc when supposing a time verification model where external terminals and circuit device terminals of a logic circuit subject to delay time verification are treated as nodes between which arcs with the same direction as signal flow between said nodes are assumed and signal delay time for a part of said logic circuit corresponding to the applicable arc is provided as the arc weight, invalidness specification means for specifying an arc and a signal type (rise or fall) of the arc with an invalid arc weight for arcs where the arc weight of only one of rise and fall signals is allowed to be valid, modification means for modifying the delay time verification information stored in said storage means so that information about arcs whose arc weight is specified by said invalidness specification means as being invalid is modified, and delay time verification means for verifying the delay time of said logic circuit based on the delay time verification information after modification by said modification means, wherein said delay time verification means selects all signal paths for said logic circuit, calculates a sum of the delay times provided for the arcs in said signal paths for each possible combination of rise and fall signals at the nodes constituting said signal paths, compares sums of delay times for the signals of the same type for signal paths with the same start and end nodes among said signal paths, and judges the delay time of the signal path with the maximum delay time to be the delay time of said logic circuit for the signal.

4. A delay time verifier for logic circuits as set forth in claim 3, further comprising:

modified model information storage means for storing delay time verification information after modification by said modification means as modified model information; and wherein said delay time verification means verifies the delay time of said logic circuit based on said delay time verification information after storage in said modified model information storage means.

5. A delay time verification method for logic circuits, comprising:

a storage step to store delay time verification information for each of a plurality of arcs including delay time for each rise/fall type of signal at a start point node and an end point node of an arc when supposing a time verification model according to graph theory where external terminals and circuit device terminals of a logic circuit are treated as nodes between which arcs with the same direction as signal flow between said nodes are assumed and signal delay time for a component of said logic circuit corresponding to the applicable arc is provided as the arc weight, an invalidness specification step to specify an arc and a signal type (rise or fall) of the arc with an invalid arc weight for arcs where the arc weight of only one of rise and fall signals is allowed to be valid, a modification step to modify said delay time verification information so that information about arcs whose arc weight is specified as being invalid is modified, and a delay time verification step to verify the delay time of said logic circuit based on the delay time verification information after modification by said modification step.

6. A delay time verification method for logic circuits as set forth in claim 5, further comprising:

a step to select all signal paths for said logic circuit, a step to calculate a sum of the delay times provided for the arcs in said signal paths for each possible combination of rise and fall signals at the nodes constituting said signal paths, a step to compare sums of delay times for the signals of the same type for signal paths with the same start and end nodes among said signal paths, and a step to judge the delay time of the signal path with the maximum delay time to be the delay time of said logic circuit for the applicable signal.

* * * * *